(12) United States Patent
Galloway

(10) Patent No.: US 11,600,550 B2
(45) Date of Patent: Mar. 7, 2023

(54) JET IMPINGEMENT COOLING FOR HIGH POWER SEMICONDUCTOR DEVICES

(71) Applicant: SEMICONDUCTOR COMPONENTS INDUSTRIES, LLC, Phoenix, AZ (US)

(72) Inventor: Jesse Emmett Galloway, Chandler, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 421 days.

(21) Appl. No.: 16/675,540

(22) Filed: Nov. 6, 2019

(65) Prior Publication Data

US 2021/0111100 A1 Apr. 15, 2021

Related U.S. Application Data

(60) Provisional application No. 62/913,563, filed on Oct. 10, 2019.

(51) Int. Cl.
*H01L 23/473* (2006.01)
*H01L 23/40* (2006.01)
*H01L 23/38* (2006.01)

(52) U.S. Cl.
CPC .......... *H01L 23/4735* (2013.01); *H01L 23/38* (2013.01); *H01L 23/40* (2013.01)

(58) Field of Classification Search
CPC ...... H01L 23/4735; H01L 23/38; H01L 23/40
See application file for complete search history.

(56) References Cited

U.S. PATENT DOCUMENTS

| | | | | |
|---|---|---|---|---|
| 5,377,911 A | * | 1/1995 | Bauer | B24C 1/003 239/128 |
| 2009/0032937 A1 | * | 2/2009 | Mann | H01L 23/4735 257/712 |
| 2011/0216502 A1 | | 9/2011 | Dede | |
| 2014/0190665 A1 | | 7/2014 | Joshi et al. | |
| 2015/0184947 A1 | | 7/2015 | Joshi | |
| 2017/0196120 A1 | | 7/2017 | Oprins et al. | |

* cited by examiner

*Primary Examiner* — Nael N Babaa
(74) *Attorney, Agent, or Firm* — Brake Hughes Bellermann LLP

(57) ABSTRACT

A jet impingement cooling assembly for semiconductor devices includes a heat exchange base having an inlet chamber and an outlet chamber. An inlet connection may be in fluid connection with the inlet chamber, while an outlet connection may be in fluid connection with the outlet chamber. A jet plate may be coupled to the inlet chamber, and a jet pedestal may be formed on the jet plate and having a raised surface with a jet nozzle formed therein.

18 Claims, 10 Drawing Sheets

JET IMPINGEMENT COOLING FOR HIGH POWER SEMICONDUCTOR DEVICES

CROSS-REFERENCE TO RELATED APPLICATIONS

This application claims the benefit of U.S. Provisional Patent Application No. 62/913,563, filed on Oct. 10, 2019, the entire contents of which is incorporated herein by reference.

TECHNICAL FIELD

This description relates to cooling techniques for semiconductor devices.

BACKGROUND

High power semiconductor devices, during operation, generate heat that may be harmful to the devices themselves, or to nearby components. For example, excess heat may cause an abrupt device breakdown, or may contribute to shortening of a device lifetime.

To mitigate such potential difficulties, liquid cooling systems may be used to cool high power semiconductor devices. For example, a pump may be used to direct a flow of water or other suitable cooling liquid to high-heat areas, to thereby facilitate heat transfer from the high-heat areas to the cooling liquid.

SUMMARY

According to one general aspect, a jet impingement cooling assembly for semiconductor devices includes a heat exchange base having an inlet chamber and an outlet chamber. An inlet connection may be in fluid connection with the inlet chamber, while an outlet connection may be in fluid connection with the outlet chamber. A jet plate may be coupled to the inlet chamber, and a jet pedestal may be formed on the jet plate and having a raised surface with a jet nozzle formed therein.

According to another general aspect, a jet plate assembly for jet impingement cooling of a semiconductor device may include a jet plate configured to be received within a heat exchange base, and a jet pedestal formed on the jet plate and having at least one jet nozzle formed within a raised surface that is raised from the jet plate surface by at least one jet pedestal wall connecting the jet plate to the raised surface. The jet plate, when received within the heat exchange base, may define a fluid flow path from an inlet chamber of the heat exchange base through the jet nozzle, and through a return path defined by the at least one jet pedestal wall to an outlet chamber of the heat exchange base.

According to another general aspect, a method of making a jet impingement cooling assembly for semiconductor devices may include forming a heat exchange base having an inlet chamber and an outlet chamber, forming an inlet connection in fluid connection with the inlet chamber, and forming an outlet connection in fluid connection with the outlet chamber. The method may include forming a jet plate configured to be coupled to the inlet chamber, and forming a jet pedestal on the jet plate and having a raised surface with a jet nozzle formed therein.

The details of one or more implementations are set forth in the accompanying drawings and the description below. Other features will be apparent from the description and drawings, and from the claims.

DETAILED DESCRIPTION

As described in detail below, embodiments include a heat exchange assembly for performing jet impingement cooling of semiconductor power modules. In example implementations, high-speed, high-pressure application of a cooling liquid may be directed with high accuracy and/or precision to identified hotspots of semiconductor power modules.

The described jet impingement heat exchange (cooling) assembly embodiments provide uniform pressure at each of a potential plurality of jet nozzles or vents, to thereby provide uniform cooling to a corresponding plurality of hotspots. The jet impingement cooling assembly is efficient, in that jet impingement occurs at least at (e.g., only at) the desired and necessary hotspots. The jet impingement cooling assembly embodiments provide direct contact of a cooling fluid to a backside of a substrate (e.g., direct bonded copper (DBC) substrate (e.g., a substrate including a dielectric disposed between a pair of metal layers for traces and/or bonding)) being cooled.

Described embodiments provide jet nozzles or vents close to a substrate surface being cooled, which defines a relatively narrow gap between a jet nozzle and the substrate. As a result, high-speed, high-pressure flow of the cooling liquid onto a desired hotspot occurs. Relatively large gaps adjacent to the jet nozzles may be provided for relatively low-speed, low-pressure flow, which may be used for semiconductor chips or other devices having a lower heat profile (e.g., diodes), and/or for efficient fluid return of the cooling fluid to a fluid pump.

Semiconductor power modules may include multiple semiconductor die (e.g., chips) or other devices, some of which may generate higher heat during operation than others. Even for semiconductor power modules having the same or similar semiconductor chips included therein, individual semiconductor chips may be placed (e.g., coupled) at different positions within or on the module.

Accordingly, the described jet impingement cooling assembly embodiments described herein are highly configurable, and may be configured to align jet impingement cooling with designated semiconductor chips or other elements requiring cooling. For example, a single base may be compatible with multiple, interchangeable jet plates, where the different jet plates may be configured to match hotspots of corresponding semiconductor power modules.

In specific examples, the described jet impingement cooling assembly may be used for cooling in the context of automobile or other engine applications. Such applications often have high power requirements within high-heat environments, while also meeting safety mandates.

Figure 1:
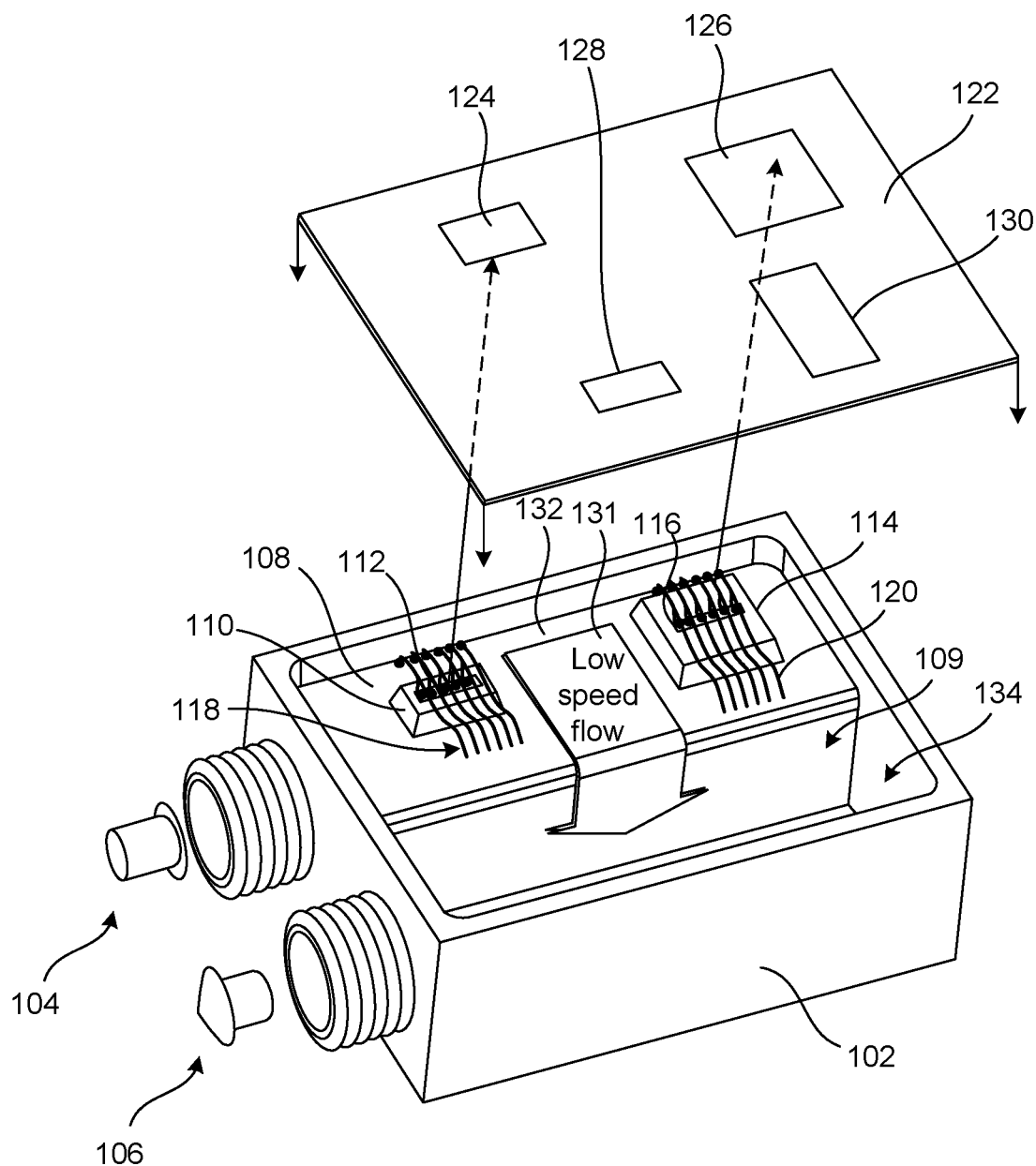
FIG. 1 is an example exploded view of a jet impingement cooling assembly for high power semiconductor devices with the electronic module lifted away from the heat exchanger.

FIG. 1 is an example exploded view of a jet impingement cooling assembly for high power semiconductor devices. In FIG. 1, a heat exchange base 102 includes an inlet connection 104 and an outlet connection 106, which may be in fluid contact with a fluid pump (not illustrated in FIG. 1). Thus, a fluid flow, such as a water flow, may be maintained through the inlet connection 104, through one or more cavities within the heat exchange base 102 as described below, and out of the outlet connection 106. In FIG. 1, the heat exchange base 102 is illustrated as having a shape of a rectangular prism, but example embodiments may utilize any suitable shape, such as, e.g., a cube or oblong-shaped housing.

A jet plate 108 may be positioned within the heat exchange base 102. For example, the heat exchange base 102 may include a chamber divider 109 that divides an interior of the heat exchange base 102 into an inlet chamber (not visible in FIG. 1, but shown, e.g., as inlet chamber 202 in FIG. 2) and outlet chamber 134, as described below.

For example, the jet plate 108 may be mountable within, and removable from, the heat exchange base 102. Accordingly, multiple jet plates 108, having various desired configurations, may be interchanged with respect to a single heat exchange base 102. In some example, the jet plate 108 may be separate from, and mounted to, the chamber divider 109. In other implementations, the jet plate 108 may be integral with the chamber divider 109, and may be inserted and/or removed in conjunction therewith.

Figure 2:
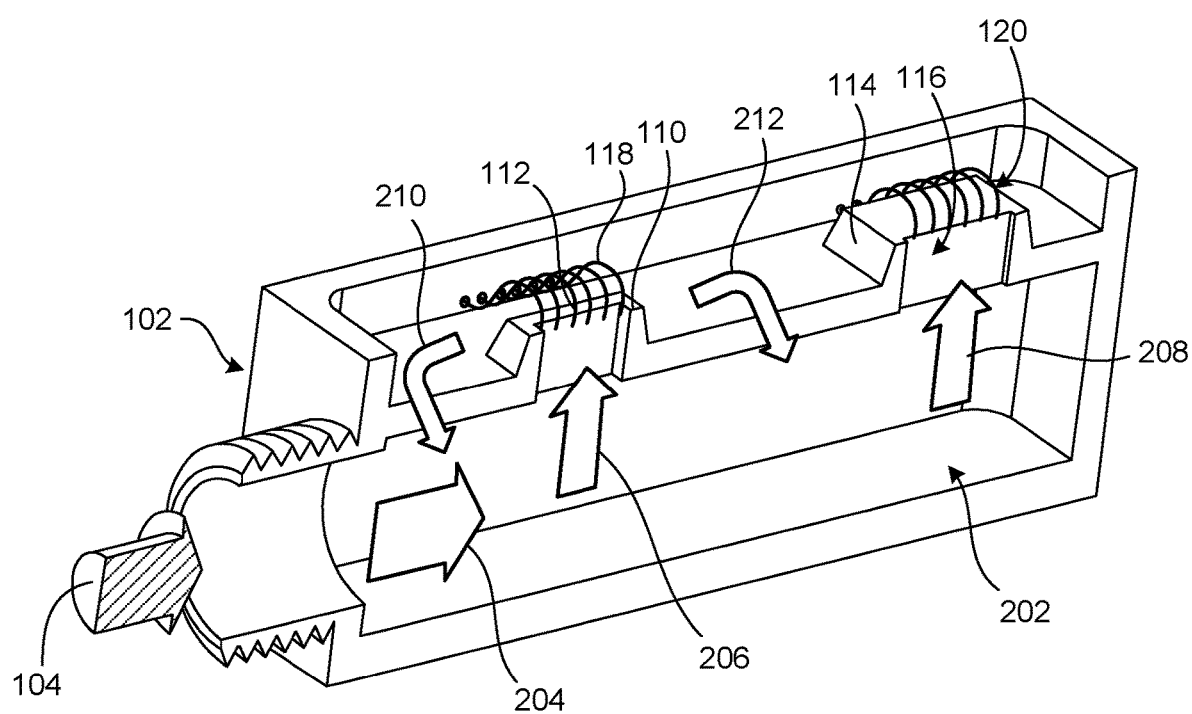
FIG. 2 is a cross-section view of the jet impingement cooling assembly of FIG. 1.

The jet plate 108 may include a raised jet pedestal 110 that includes a jet vent or nozzle 112 as shown in the cross-section view in FIG. 2. The jet plate 108 also includes a jet pedestal 114 that includes a jet nozzle 116. Put another way, the jet pedestals 110, 114 each have a raised surface in which corresponding jet nozzles 112, 116 are formed. Although the example of FIG. 1 illustrates the jet plate 108 with the two jet pedestals 110, 114, other example implementations of the jet plate 108 may include a single jet pedestal, or may include three or more jet pedestals.

The jet nozzle 112 provides a vent, gap, or opening through which pressurized fluid flowing through the inlet connection 104 is forced, shown as high-speed fluid flow 118. Similarly, the jet nozzle 116 also provides a vent, gap, or opening through which pressurized fluid flowing through the inlet connection 104 is forced, shown as high-speed fluid flow 120. Thus, the jet plate 108 forms a sealed connection with the chamber divider 109 and with the heat exchange base 102, so that any fluid received by way of the inlet connection 104 is forced through the jet nozzles 112, 116.

A semiconductor power module 122 may include a circuit board or other assembly of a plurality of semiconductor chips, or other devices, illustrated in FIG. 1 generically as devices 124, 126, 128, and 130. As referenced above, some of the semiconductor power module devices 124-130 may have high heat signatures, while others may require little or no cooling. For the sake of the example of FIG. 1, devices 124 and 126 are assumed to have high heat signatures and form relative hotspots, while devices 128, 130 are assumed to have low heat signatures, and require little cooling.

Then, as referenced above, and illustrated in FIG. 1, the heat exchange base 102 is configured to receive the semiconductor power module 122, so that the jet nozzles 112, 116 may be positioned to be directly below the devices 124, 126, respectively, when the semiconductor power module 122 is attached to the heat exchange base 102. Consequently, fluid flow from the inlet connection 104 may be forced through the jet nozzles 112, 116, and may then impinge directly onto corresponding backside of the devices 124, 126. Such an approach provides highly-efficient and direct cooling of the devices 124, 126.

Following this jet impingement onto the devices 124, 126, the fluid flow may proceed through relatively wide fluid-return channels defined between the jet pedestals 110, 114, or between one of the jet pedestals 110, 114 and at least one wall of the heat exchange base 102. For example, in FIG. 1, a relatively low-speed fluid flow 131 is illustrated as occurring within a wide gap or channel 132 defined between the jet pedestals 110, 114. The return fluid flow may also be constrained by the presence of the semiconductor power module 122, as attached to the heat exchange base 102.

As illustrated in FIG. 1, the return fluid flow may proceed through the outlet chamber 134 and then through the outlet connection 106, to thereby return to the fluid pump being used. In some implementations, the presence of the return fluid flow through the outlet chamber 134 may provide additional cooling to the devices 128, 130 of the semiconductor power module 122. That is, in the example of FIG. 1, it may be assumed that the devices 128, 130 require significantly less cooling than the devices 124, 126, so that associated cooling demands may be met without requiring the type of jet impingement described with respect to the devices 124, 126.

FIG. 2 is a cross-section view of the jet impingement cooling assembly of FIG. 1. In FIG. 2, the inlet chamber 202 is visible, and the described fluid flow is illustrated in more detail.

In particular, inlet fluid flow 204 is illustrated as translating into pressurized flows 206, 208, which are vented through jet nozzles 112, 116, respectively. Return fluid flow is shown in FIG. 2 as relatively low-speed flow 210 proceeding between the jet pedestal 110 and a wall of the heat exchange base 102, as well as relatively low-speed flow 212 proceeding between the jet pedestals 110, 114.

Figure 3:
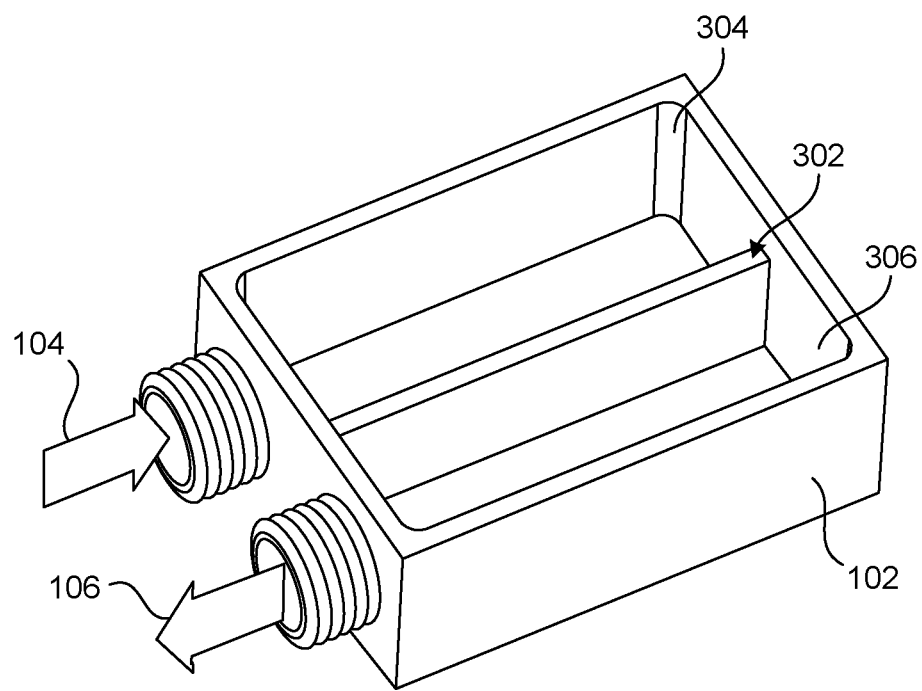
FIG. 3 is a further view of the heat exchanger base of the jet impingement cooling assembly of FIG. 1.

FIG. 3 is a further view of the heat exchanger housing of FIG. 1. In the implementation of FIG. 3, a chamber divider 302, corresponding to an implementation of the chamber divider 109 of FIG. 1, is illustrated. That is, as referenced above, the chamber divider 109 of FIG. 1 may represent a divider integrated with the jet plate 108, or a separate divider attached to the heat exchange base 102. FIG. 3 illustrates the latter scenario, in which the chamber divider 302 is integral with, or attached to, walls of the heat exchange base 102, and divides an interior of the heat exchange base 102 into an inlet chamber 304 and an outlet chamber 306.

Figure 4A:
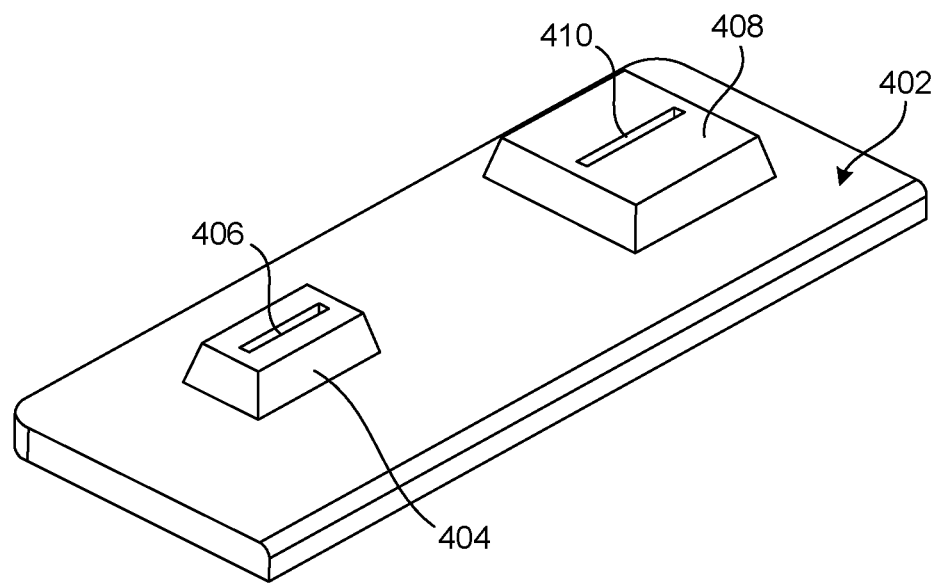
FIG. 4A illustrates an example jet plate that may be used in conjunction with the example implementations of FIGS. 1-3.

FIG. 4A illustrates an example jet plate 402 that may be used in conjunction with the example implementations of FIGS. 1-3. In particular, the jet plate 402 is illustrated as being separate from the chamber divider 302 of FIG. 3, and suitable for mounting above the inlet chamber 304.

In FIG. 4A, a jet pedestal 404 is illustrated as having a jet nozzle 406, while a jet pedestal 408 is illustrated as having a jet nozzle 410. In the example of FIG. 4, the jet pedestals 404, 408 are illustrated as trapezoidal prisms, while the jet nozzles 406, 410 are illustrated as rectangular, but other configurations may be used, as well, such as circular, or ellipsoidal. In general, jet pedestals may define volumes which decrease along a direction of fluid flow therethrough during cooling operations, so as to direct and concentrate high-pressure fluid flow through the jet nozzles 406, 410. In some implementations, however, the jet pedestals may have walls that are entirely perpendicular to a surface of the jet plate 402. Further, the jet nozzles 406, 410 may be formed as shapes other than rectangles, such as squares, circles, or ovals.

As illustrated in both FIG. 1 and FIG. 4A, a width and length of the various jet pedestals may be generally matched to corresponding devices to be cooled (such as the devices 124, 126 of FIG. 1). A height of each jet pedestal is also configurable, within a range suitable for maintaining high-speed, high-pressure jet impingement onto a device being cooled.

Put another way, a jet pedestal height defines a relatively narrow gap or space between a corresponding jet nozzle and a device being cooled. By matching planar or surface dimensions of a jet pedestal with its corresponding device being cooled, cooling fluid may be maintained in further contact with the device being cooled following the jet impingement and prior to returning to an outlet chamber (e.g., 134 of FIG. 1, or 304 of FIG. 3).). The profile on the jet pedestal top surface may be parallel to the backside surface of the semiconductor module shown in FIG. 1, or may have a sloped surface, to produce either accelerating or decelerating flow.

Figure 4B:
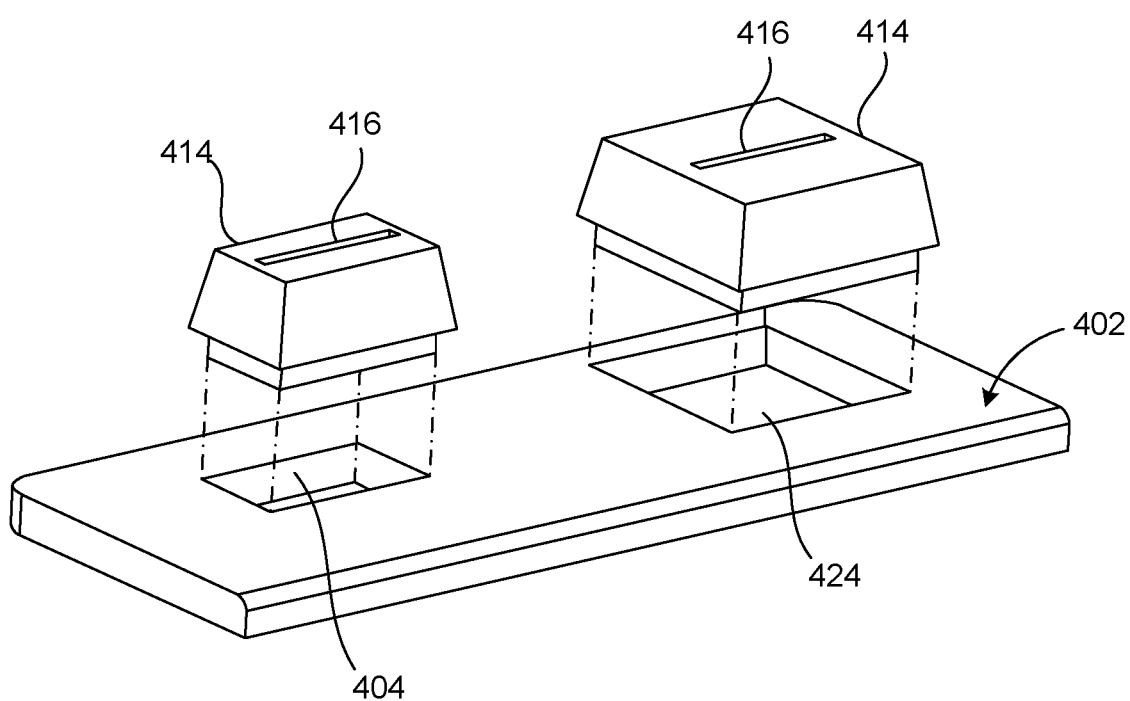
FIG. 4B illustrates an example of interchangeable jet pedestals that may be used with the example jet plate of FIG. 4A.

In FIG. 4B, a jet plate 424 is similar to the jet plate 402 of FIG. 4A, but an opening 412 is illustrate as receiving an interchangeable jet pedestal 414 and included jet nozzle 416. Similarly, an opening 418 may receive an interchangeable jet pedestal 420 and included net nozzle 418. For example, embodiments similar to that of FIG. 4B may be used in any scenarios in which a location of a jet nozzle center does not change from one application to another, but a desired coverage area increases or decreases. Thus, in general, a jet pedestal may be removable from a jet plate and interchangeable with a second jet pedestal having a second jet nozzle of a different size than the first jet nozzle.

In FIGS. 1-3, inlet connection 104 and outlet connection 106 are illustrated as being located in the same side or wall of the heat exchange base 102, 302. In other example implementations, however, such as illustrated with respect to FIGS. 5-7, the connections may be located on different base walls.

Figure 5:
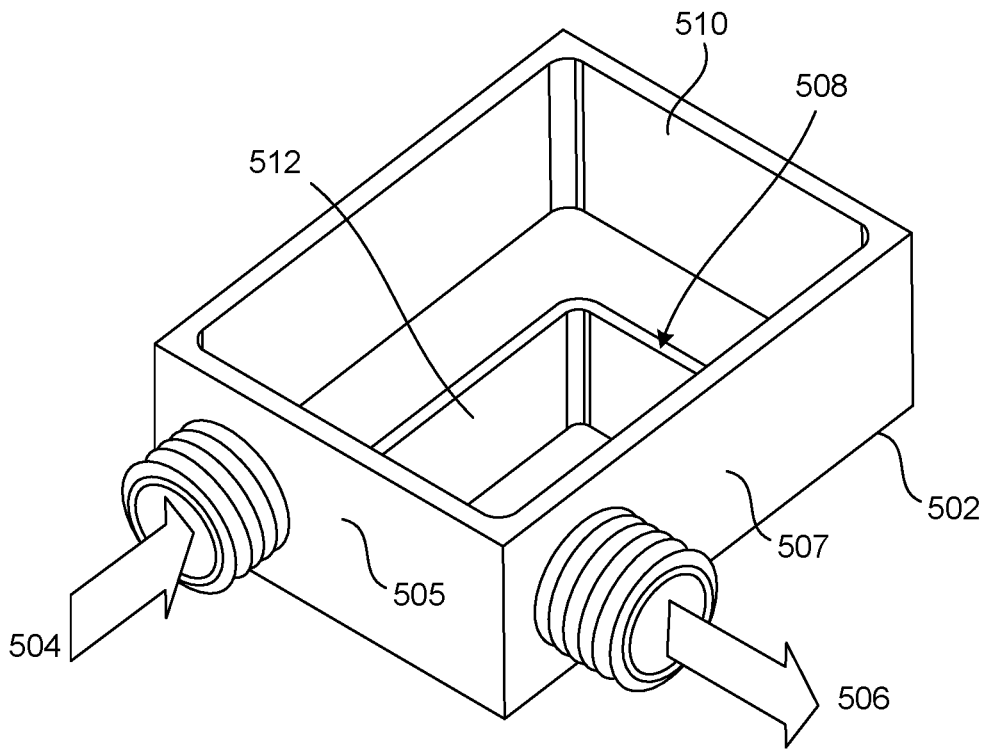
FIG. 5 is an example of a heat exchanger base showing an alternative fluid exit direction.

For example, in FIG. 5, a heat exchange base 502 has an inlet connection 504 constructed through a wall 505, and an outlet connection 506 at a right angle to the inlet connection 504, and constructed through a wall 507 that is at a right angle to the wall 505.

Then, a chamber divider 508 defines an inlet chamber 510 and an outlet chamber 512. As a result, the embodiment of FIG. 5 may be utilized in conjunction with jet plates having different constructions than those shown above.

Figure 6:
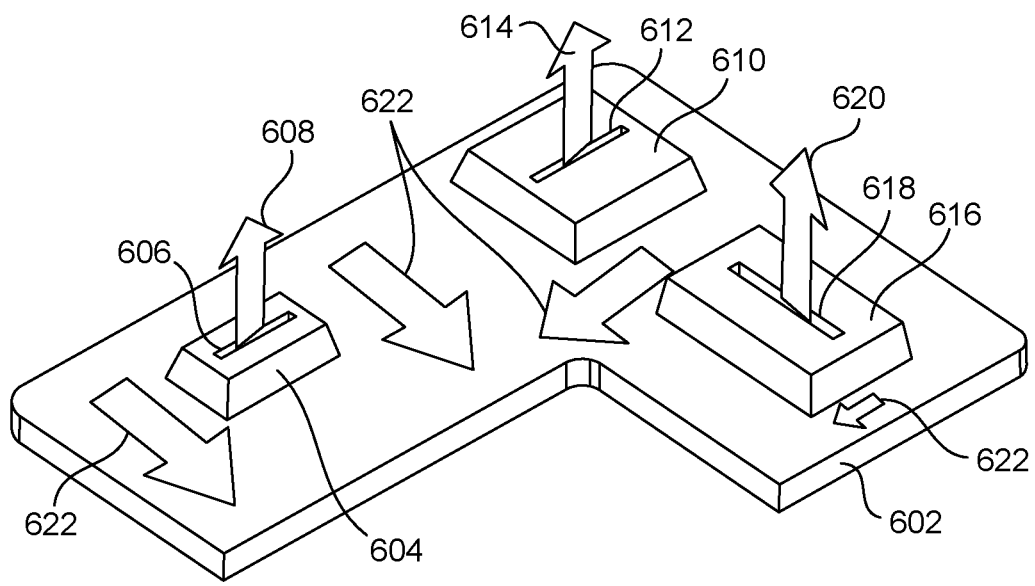
FIG. 6 illustrates an example jet plate, showing flexibility in jet nozzle number and location, that may be used in conjunction with the example of FIG. 5.

For example, FIG. 6 illustrates an L-shaped jet plate 602 that is configured for mounting above, and for covering and sealing, the inlet chamber 510 of FIG. 5. As shown, the L-shaped jet plate 602 includes a jet pedestal 604 having a jet nozzle 606 that defines a jet impingement fluid flow 608. Further, the L-shaped jet plate 602 includes a jet pedestal 610 having a jet nozzle 612 that defines a jet impingement fluid flow 614. Still further, the L-shaped jet plate 602 includes a jet pedestal 616 having a jet nozzle 618 that defines a jet impingement fluid flow 620. Then, relatively low-speed, low-pressure flows 622 may occur between the jet pedestals 604, 610, and 616, and between the jet pedestal 604 and the wall 505, and between the jet pedestal 616 and the wall 507.

Figure 7:
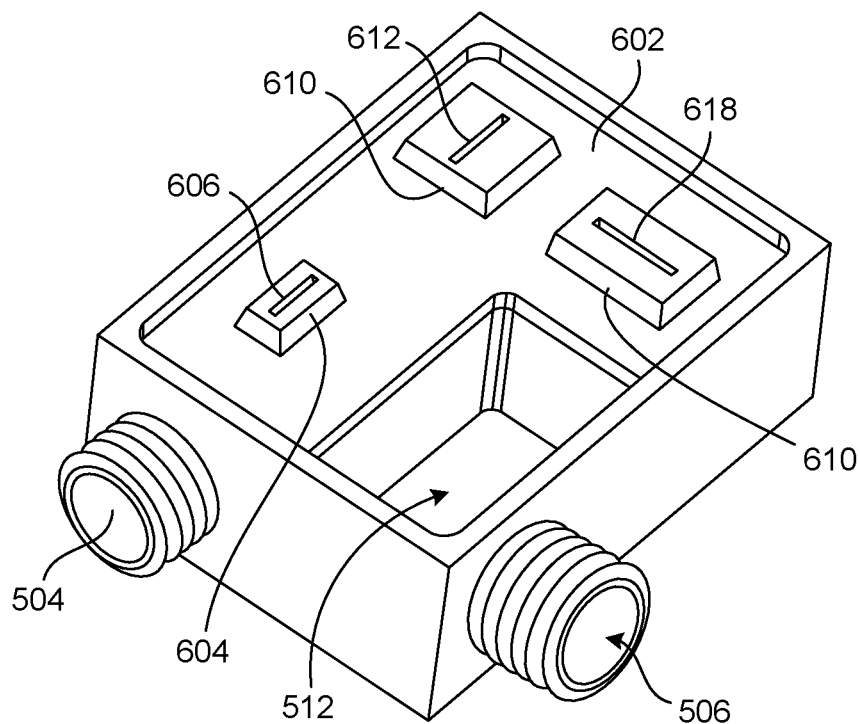
FIG. 7 is an assembled view of the example jet impingement cooling assembly of FIG. 5, with the example jet plate of FIG. 6 installed therein.

FIG. 7 is a cut-away view of the example jet impingement cooling assembly of FIG. 5, with the example jet plate of FIG. 6 installed therein. Although not illustrated in FIG. 7, it will be appreciated that the example of FIG. 7 may be designed for use with a semiconductor power module in which individual semiconductor chips or devices are shaped and arranged in an L-shaped configuration, and generally sized and spaced to align the centers of each such device with centers of the various jet nozzles 606, 612, 618. As in FIG. 1, such a semiconductor power module may also include an additional low-power device(s) that may be configured to align with the outlet chamber 512.

Figure 8:
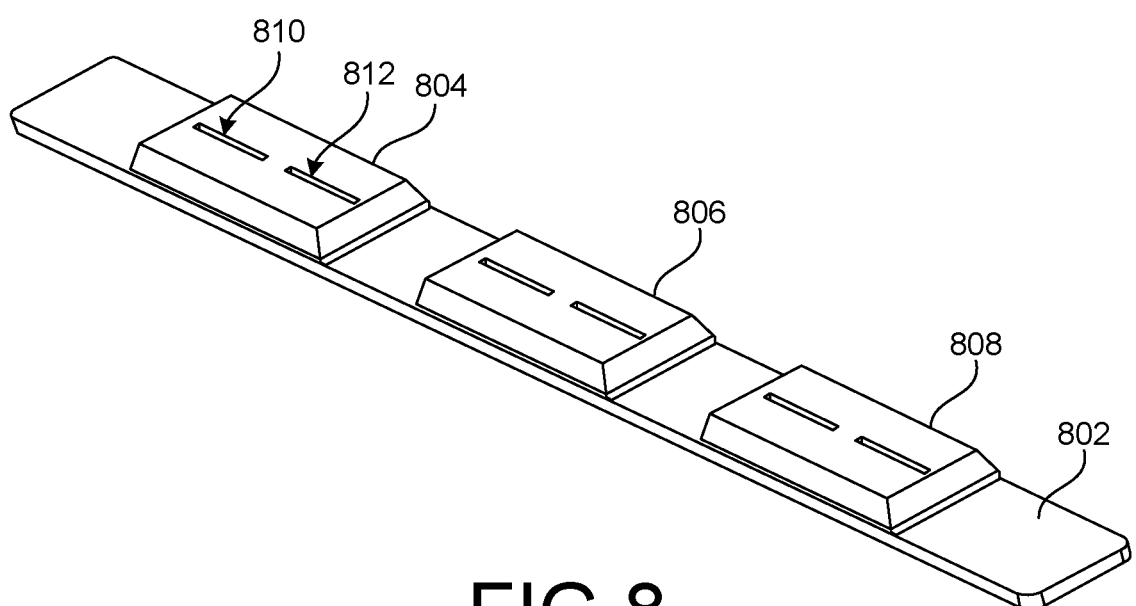
FIG. 8 illustrates another example jet plate, used to cool three electronic packages.

FIG. 8 illustrates another example jet plate 802. In the example of FIG. 8, the jet plate 802 includes three jet pedestals 804, 806, 808, arranged linearly. As designated specifically with respect to jet pedestal 804, but common to jet pedestals 806, 808, as well, the jet pedestal 804 includes dual jet nozzles 810, 812.

Figure 9A:
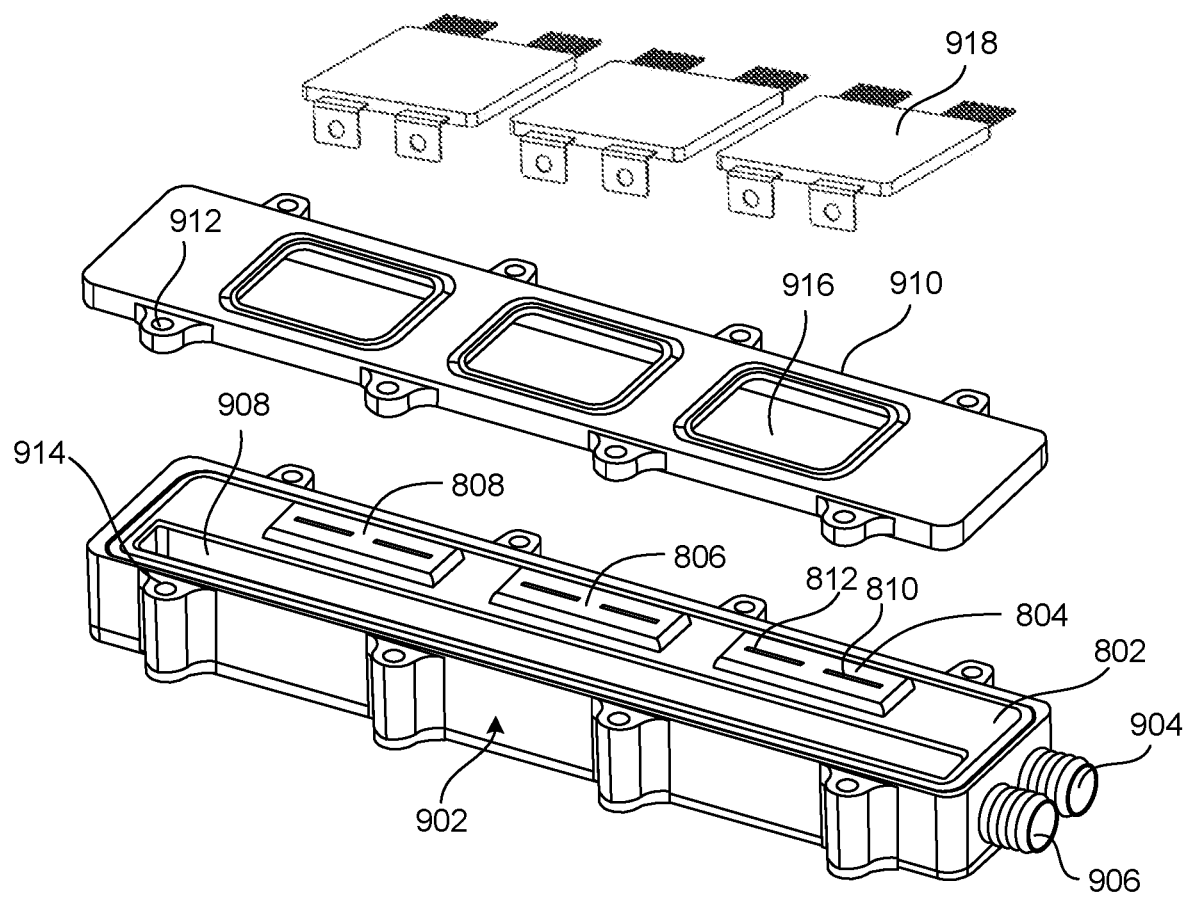
FIG. 9A illustrates another example embodiment of the jet impingement cooling assembly of FIG. 1, using the example jet plate of FIG. 8.

FIG. 9A illustrates another example embodiment of the jet impingement cooling assembly of FIG. 1, using the example jet plate of FIG. 8. As shown, a heat exchange base 902 has an inlet connection 904 and an outlet connection 906. The interchangeable jet plate 802 is mounted within the heat exchange base 902. An inlet chamber beneath the jet plate 802 and in fluid connection with the inlet connection 904 is not visible in FIG. 9, while an outlet chamber 908 is shown in fluid connection with the outlet connection 906.

In FIG. 9A, an attachment plate 910 is illustrated as being configured for attachment to the heat exchange base 902. FIG. 9A illustrates screw attachments 912, 914, but any suitable attachment means may be used.

The attachment plate 910 is illustrated as having module-mounting openings 916, which are sized and/or configured to receive (e.g., be coupled to or adjacent to) semiconductor power module(s) 918. As illustrated in FIG. 9, and described herein, the jet pedestals 804, 806, 808 and included jet nozzles (e.g., 810, 812) may be selected and configured to correspond to individual device elements 920, 922 of the power module 918.

Figure 9B:
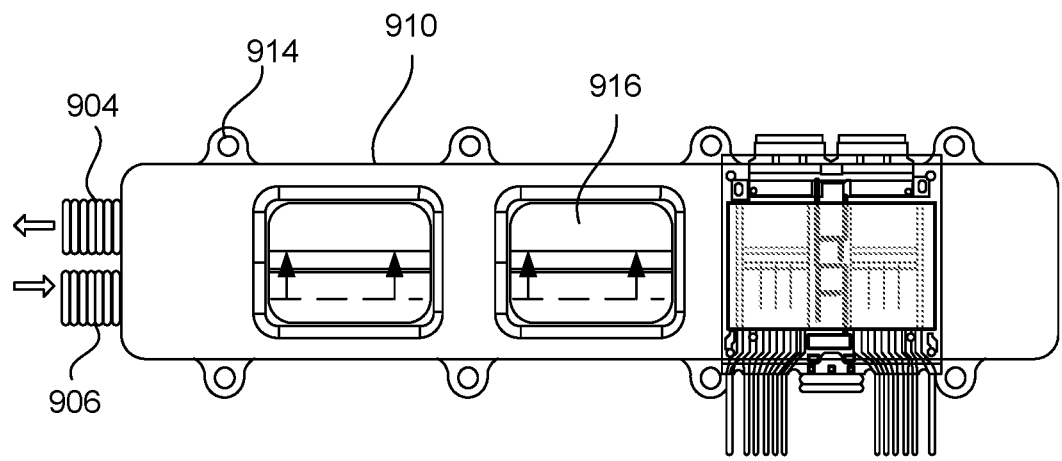
FIG. 9B is another example view of the example of FIG. 9A.

FIG. 9B is another example view of the example of FIG. 9A. FIG. 9B is a top view illustrating that the module-mounting openings 916 may be opened or closed on an as-needed basis, depending on a number of semiconductor power modules 918 to be added.

Figure 9C:
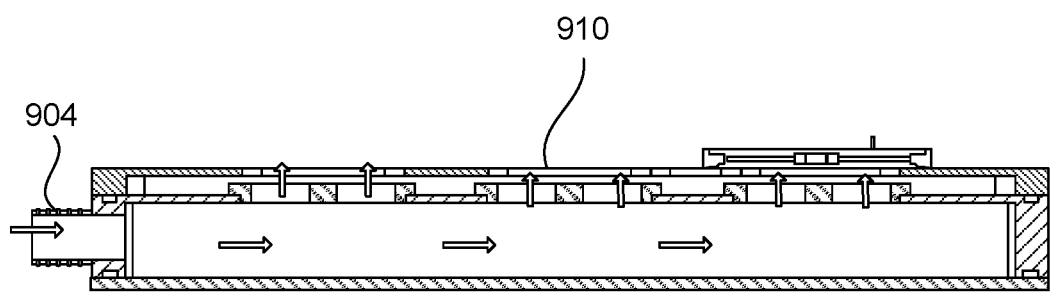
FIG. 9C is an example cross-section view of the example of FIGS. 9A and 9B.

FIG. 9C is an example cross-section view of the example of FIGS. 9A and 9B. As illustrated, FIG. 9C shows fluid flow 924 through the inlet connection 904 and the various jet pedestals 804, 806, 808, and then through the jet nozzles 810, 812.

Figure 10:
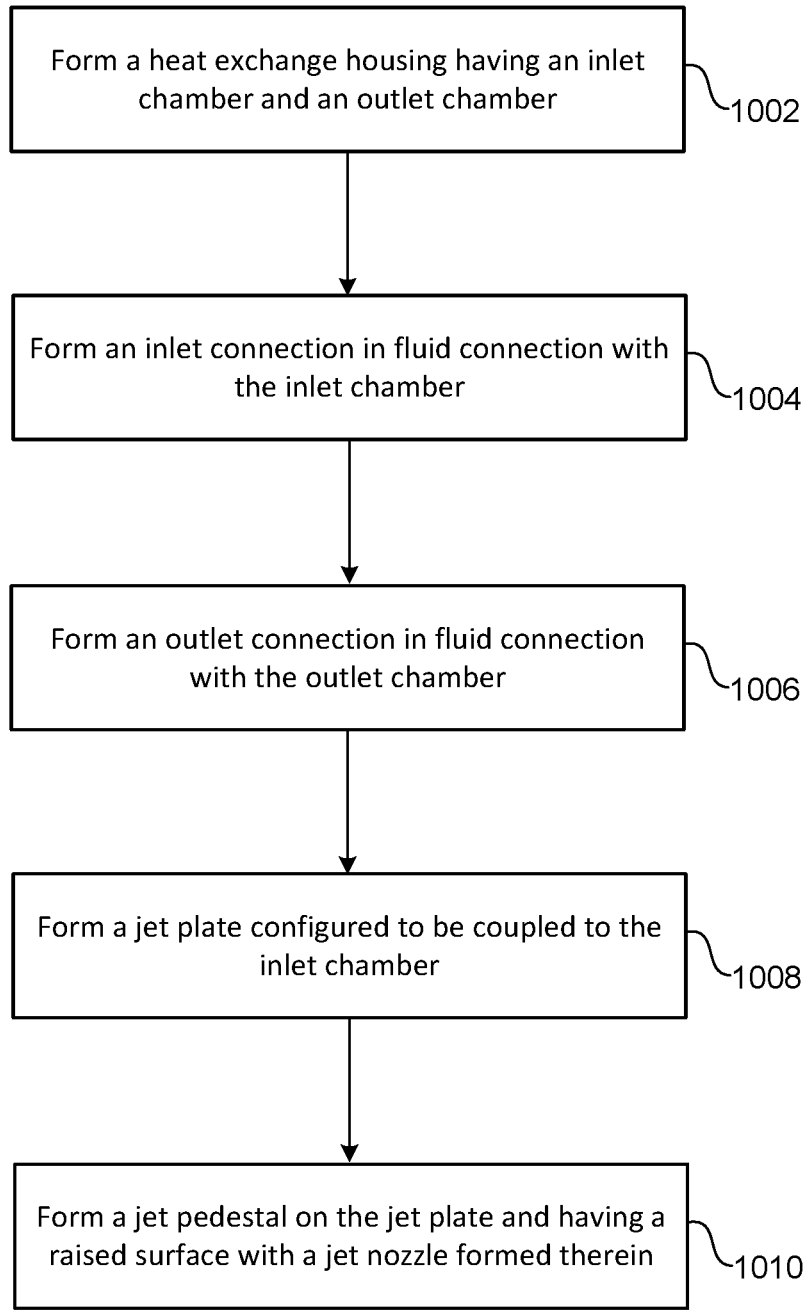
FIG. 10 is a flowchart illustrating an example manufacturing process for making a jet impingement cooling assembly, in accordance with example embodiments described herein.

FIG. 10 is a flowchart illustrating an example manufacturing process for making a jet impingement cooling assembly, in accordance with example embodiments described herein. In the simplified, non-limiting example of FIG. 10, the operations 1002-1010 are illustrates as separate, sequential operations. However, in some example implementations, additional or alternative operations or sub-operations may be included, or two or more operations may be implemented together as a single operation.

In the example of FIG. 10, a heat exchange base having an inlet chamber and an outlet chamber may be formed (1002). An inlet connection in fluid connection with the inlet chamber may be formed (1004), and an outlet connection in fluid connection with the outlet chamber may be formed (1006).

A jet plate configured to be coupled to the inlet chamber may be formed (1008). A jet pedestal may be formed on the jet plate and having a raised surface with a jet nozzle formed therein (1010).

In various examples, as described herein, the jet pedestal may be positioned on the jet plate to cause jet impingement of fluid flow from the inlet chamber through the jet nozzle and onto the backside of the semiconductor device. A fluid flow path may be defined from the inlet connection to the inlet chamber, through the jet nozzle, onto the backside of the semiconductor device, through at least one return channel defined by pedestal walls of the jet pedestal and thereby to the outlet chamber, and from the outlet chamber through the outlet connection.

The return channel may be defined between the pedestal walls and at least one wall of the heat exchange base. The jet plate may include a second jet pedestal with a second jet nozzle, and the return channel may be defined between the pedestal and the second pedestal.

The jet pedestal may have a first configuration on the jet plate, and the jet plate may be interchangeable within the heat exchange base with a second jet plate with at least a second pedestal having a second configuration.

Jet plates can have any suitable number of jet pedestals arranged and oriented in any suitable manner relative to one another. Any jet pedestal may have one, two, or more jet nozzles. Different jet pedestals on the same jet plate may have a different number, shape, size, or configuration of jet nozzles. Multiple jet plates may be sized to fit a single heat exchange base, so that it is possible to interchange jet plates to perform jet impingement cooling on a corresponding plurality of semiconductor power modules that are also compatible with the same heat exchange base.

Figure 11:
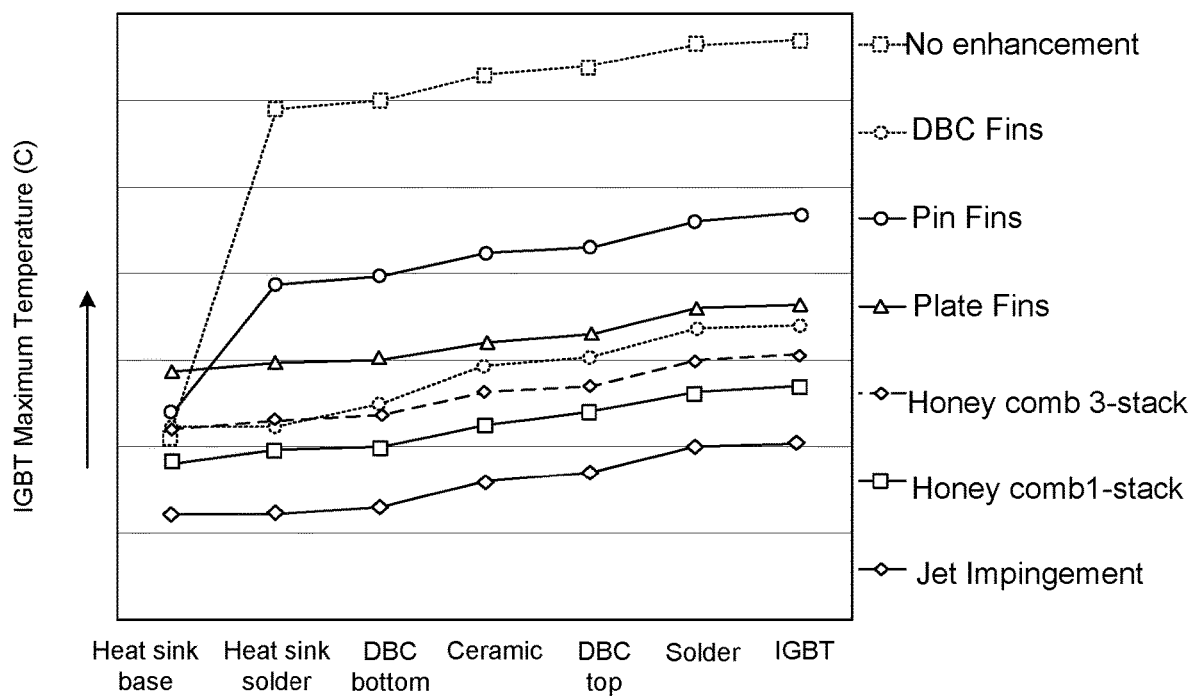
FIG. 11 illustrates a graph demonstrating improved cooling provided by the various embodiments described herein, as compared to conventional techniques.

FIG. 11 illustrates a graph demonstrating improved cooling provided by the various embodiments described herein, as compared to conventional techniques. As shown, maximum temperature ranges for each of a plurality of potential hotspots of semiconductor power modules (e.g., heat sink base, heat sink solder, DBC, Ceramic, DBC top, Solder, or IGBT (Insulated gate bipolar transistor)) are significantly lower for the jet impingement techniques described herein as compared to scenarios with no cooling enhancements, or to other, conventional techniques (e.g., DBC fins, pin fins, plate fins, honeycomb 3-stack, or honeycomb 5-stack).

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A jet impingement cooling assembly for semiconductor devices, comprising:
   a heat exchange base having an inlet chamber and an outlet chamber;
   an inlet connection in fluid connection with the inlet chamber;
   an outlet connection in fluid connection with the outlet chamber;
   a jet plate coupled to the inlet chamber; and
   a jet pedestal formed on the jet plate and having a raised surface with a jet nozzle formed therein, wherein the jet pedestal has a first configuration on the jet plate, and further wherein the jet plate is interchangeable within the heat exchange base with a second jet plate with at least a second jet pedestal having a second configuration.

2. The jet impingement cooling assembly for semiconductor devices of claim 1, wherein the heat exchange base is configured to receive a semiconductor module including at least one semiconductor device with a frontside facing away from the inlet chamber and a backside facing the jet plate.

3. The jet impingement cooling assembly for semiconductor devices of claim 2, wherein the jet pedestal is positioned on the jet plate to cause jet impingement of fluid flow from the inlet chamber through the jet nozzle and onto the backside of the semiconductor device.

4. The jet impingement cooling assembly for semiconductor devices of claim 3, wherein a fluid flow path is defined from the inlet connection to the inlet chamber, through the jet nozzle, onto the backside of the semiconductor device, through at least one return channel defined by pedestal walls of the jet pedestal and thereby to the outlet chamber, and from the outlet chamber through the outlet connection.

5. The jet impingement cooling assembly for semiconductor devices of claim 4, wherein the return channel is defined between the pedestal walls and at least one wall of the heat exchange base.

6. The jet impingement cooling assembly for semiconductor devices of claim 4, wherein the jet plate has at least two jet pedestals, and further wherein the return channel is defined between the at least two jet pedestals.

7. The jet impingement cooling assembly for semiconductor devices of claim 1, wherein the inlet connection and the outlet connection are positioned on a single side of the heat exchange base.

8. The jet impingement cooling assembly for semiconductor devices of claim 1, wherein the inlet connection is positioned on a first side of the heat exchange base and the outlet connection is positioned on a second side of the heat exchange base.

9. The jet impingement cooling assembly for semiconductor devices of claim 1, further comprising a chamber divider within the heat exchange base and defining the inlet chamber on a first side thereof, and the outlet chamber on a second side thereof, the chamber divider being coupled to the heat exchange base and configured to receive the jet plate.

10. The jet impingement cooling assembly for semiconductor devices of claim 1, further comprising a chamber divider within the heat exchange base and defining the inlet chamber on a first side thereof, and the outlet chamber on a second side thereof, the chamber divider being coupled to the jet plate and configured to be received within the heat exchange base together with the jet plate.

11. The jet impingement cooling assembly for semiconductor devices of claim 1, wherein the second configuration includes a second jet nozzle of a different size than the first jet nozzle.

12. A jet plate assembly for jet impingement cooling of a semiconductor device, comprising:
  a jet plate configured to be received within a heat exchange base; and
  a jet pedestal formed on the jet plate and having at least one jet nozzle formed within a raised surface that is raised from the jet plate surface by at least one jet pedestal wall connecting the jet plate to the raised surface,
  wherein the jet plate, when received within the heat exchange base, defines a fluid flow path from an inlet chamber of the heat exchange base through the jet nozzle, and through a return path defined by the at least one jet pedestal wall to an outlet chamber of the heat exchange base,
  wherein the jet pedestal has a first configuration on the jet plate, and further wherein the jet plate is interchangeable within the heat exchange base with a second jet plate with at least a second pedestal having a second configuration.

13. The jet plate assembly for jet impingement cooling of a semiconductor device of claim 12, wherein the jet plate is configured to be coupled to at least one wall of the heat exchange base, and to a chamber divider of the heat exchange base that separates the inlet chamber and the outlet chamber.

14. The jet plate assembly for jet impingement cooling of a semiconductor device of claim 12, wherein the jet pedestal is positioned on the jet plate to cause jet impingement of fluid flow from the inlet chamber through the jet nozzle and onto a backside of a semiconductor device mounted on a semiconductor module that is coupled to the heat exchange base, as part of the fluid flow path.

15. The jet plate assembly for jet impingement cooling of a semiconductor device of claim 12, wherein the jet plate includes at least two jet pedestals.

16. A method of making a jet impingement cooling assembly for semiconductor devices, comprising:
  forming a heat exchange base having an inlet chamber and an outlet chamber, including forming the inlet chamber with a mounting surface configured to be coupled to any of at least two interchangeable jet plates, including at least a first jet plate and a second jet plate;
  forming an inlet connection in fluid connection with the inlet chamber; and
  forming an outlet connection in fluid connection with the outlet chamber, wherein the first jet plate includes a first jet pedestal having a first configuration on the first jet plate, and the second jet plate includes a second pedestal having a second configuration on the second jet plate.

17. The method of claim 16, further comprising:
forming the jet pedestal as a trapezoidal prism.

18. The method of claim 16, further comprising:
forming a chamber divider within the heat exchange base that separates the inlet chamber from the outlet chamber, and that is configured to receive the jet plate.

* * * * *